US008846273B2

(12) United States Patent
Wang et al.

(10) Patent No.: US 8,846,273 B2
(45) Date of Patent: Sep. 30, 2014

(54) PHOTOMASKS, METHODS OF FORMING A PHOTOMASK, AND METHODS OF PHOTOLITHOGRAPHICALLY PATTERNING A SUBSTRATE

(75) Inventors: Fei Wang, Boise, ID (US); Ezequiel Vidal Russell, Boise, ID (US); Chung-Yi Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 57 days.

(21) Appl. No.: 13/488,231

(22) Filed: Jun. 4, 2012

(65) Prior Publication Data

US 2013/0323627 A1     Dec. 5, 2013

(51) Int. Cl.
*G03F 1/00* (2012.01)
*G03F 1/30* (2012.01)

(52) U.S. Cl.
CPC ... *G03F 1/00* (2013.01); *G03F 1/30* (2013.01)
USPC ............................................. 430/5; 430/311

(58) Field of Classification Search
USPC ..................................... 430/5, 311
See application file for complete search history.

(56) References Cited

U.S. PATENT DOCUMENTS

| | | | |
|---|---|---|---|
| 3,969,743 A | 7/1976 | Gorski | |
| 5,418,095 A | 5/1995 | Vasudev et al. | |
| 5,804,336 A | 9/1998 | Rolfson | |
| 5,942,355 A | 8/1999 | Brainerd et al. | |
| 6,004,699 A | * 12/1999 | Yasuzato et al. | 430/5 |
| 6,150,058 A | 11/2000 | Tu et al. | |
| 6,183,915 B1 | 2/2001 | Rolfson | |
| 6,207,333 B1 | 3/2001 | Adair et al. | |
| 6,395,432 B1 | 5/2002 | Rolfson | |
| 6,482,555 B2 | 11/2002 | Chen et al. | |
| 6,566,021 B2 | 5/2003 | Wang et al. | |
| 6,576,375 B1 | 6/2003 | Miyoshi et al. | |
| 6,599,666 B2 | 7/2003 | Rolfson | |
| 6,605,396 B2 | 8/2003 | Schroeder et al. | |
| 6,696,224 B2 | 2/2004 | Rolfson | |
| 6,759,171 B1 | 7/2004 | Kalk | |
| 6,841,309 B1 | 1/2005 | Alpay et al. | |
| 6,875,545 B2 | 4/2005 | Eurlings et al. | |
| 6,883,159 B2 | 4/2005 | Schenker et al. | |
| 6,908,715 B2 | 6/2005 | Rolfson | |
| 7,247,574 B2 | 7/2007 | Broeke et al. | |

(Continued)

FOREIGN PATENT DOCUMENTS

| | | |
|---|---|---|
| TW | 097119958 | 5/2012 |
| WO | PCT/US2008/063503 | 9/2008 |
| WO | PCT/US2008/063503 | 12/2009 |

OTHER PUBLICATIONS

Yamamoto et al.: Mask Topography Effect With Polarization at Hyper NA; Proc. SPIE 6154, Optical Microlithography XIX; Mar. 21, 2006; pp. 61544F-1-61544F-9.

*Primary Examiner* — Stewart Fraser
(74) *Attorney, Agent, or Firm* — Wells St. John, P.S.

(57) ABSTRACT

A photomask includes a substrate having a device region and an adjacent edge region over transparent material. The device region includes spaced primary features of constant pitch at least adjacent the edge region. The edge region includes spaced sub-resolution assist features of the constant pitch of the spaced primary features at least adjacent the device region and which are off-phase by from about 30° to about 150° from +/−180°. Additional embodiments, including methods, are disclosed.

22 Claims, 5 Drawing Sheets

(56) References Cited

U.S. PATENT DOCUMENTS

| | | |
|---|---|---|
| 7,594,199 B2 | 9/2009 | Socha et al. |
| 7,604,906 B1 | 10/2009 | Volk et al. |
| 8,084,169 B2 | 12/2011 | Hamouda |
| 8,440,371 B2 * | 5/2013 | He et al. ............................ 430/5 |
| 2003/0178703 A1 | 9/2003 | Schenker et al. |
| 2005/0149900 A1 | 7/2005 | Laidig |
| 2005/0280890 A1 | 12/2005 | Otani et al. |
| 2006/0019178 A1 | 1/2006 | Lee et al. |
| 2006/0088771 A1 | 4/2006 | Tan et al. |
| 2006/0257751 A1 | 11/2006 | Eggers et al. |
| 2008/0311485 A1 | 12/2008 | Stanton et al. |
| 2011/0294045 A1 * | 12/2011 | Nagai et al. ....................... 430/5 |
| 2012/0178026 A1 * | 7/2012 | He et al. ........................ 430/319 |
| 2013/0017474 A1 * | 1/2013 | Chiang et al. ..................... 430/5 |

\* cited by examiner

US 8,846,273 B2

PHOTOMASKS, METHODS OF FORMING A PHOTOMASK, AND METHODS OF PHOTOLITHOGRAPHICALLY PATTERNING A SUBSTRATE

TECHNICAL FIELD

Embodiments disclosed herein pertain to photomasks, to methods of forming a photomask, and to methods of photolithographically patterning a substrate.

BACKGROUND

Photolithography is commonly used during formation of integrated circuits on substrates. More specifically, a form of actinic energy (such as, for example, ultraviolet light) is passed through a radiation-patterning tool and onto an imaging material (e.g., photoresist) of a substrate. The radiation-patterning tool can be, for example, a photomask or a reticle, with the term "photomask" traditionally referring to masks which define a pattern for an entirety of a wafer substrate, and the term "reticle" traditionally being understood to refer to a patterning tool which defines a pattern for only a portion of the wafer substrate. However, the terms "photomask" (or more generally "mask") and "reticle" are frequently used interchangeably so that either term can refer to a radiation-patterning tool that encompasses either a portion or an entirety of a wafer, and is so used herein. The actinic energy impinging upon the imaging material impacts the solubility of the exposed regions versus the unexposed regions in certain developing solvents. The imaging material is then solvent processed to remove one or the other of the exposed or the unexposed regions, thereby forming the imaging material to have mask openings extending partially or wholly therethrough. The remaining patterned imaging material can then be used as a mask for processing underlying substrate material, such as, for example, ion implanting or etching through the openings in the imaging material.

In some instances, the primary features (i.e., features intended to be patterned into an imaging layer on the substrate) may be formed into an array of a repeating pattern. For example, primary features in the form of contact openings, trenches/indentations, and/or conductive lines may be formed within a device region or array to have uniform size, shape, and pitch. At the edges of the device region, optical proximity effects may occur which can make the primary features along the edges of the device region pattern differently than those that are away from the edges. One manner of contending with this adverse phenomenon is to use what are referred to as sub-resolution assist features at the edges of the device region. These assist features are made of a sufficiently small size and suitable material so that they are "sub-resolution" to the imaging material, meaning that they do not print on the substrate. A problem is now developing wherein the desired small sub-resolution assist features at the edges of the device region are getting too small to be created in fabrication of the photomasks.

DETAILED DESCRIPTION OF EXAMPLE EMBODIMENTS

Figure 1:
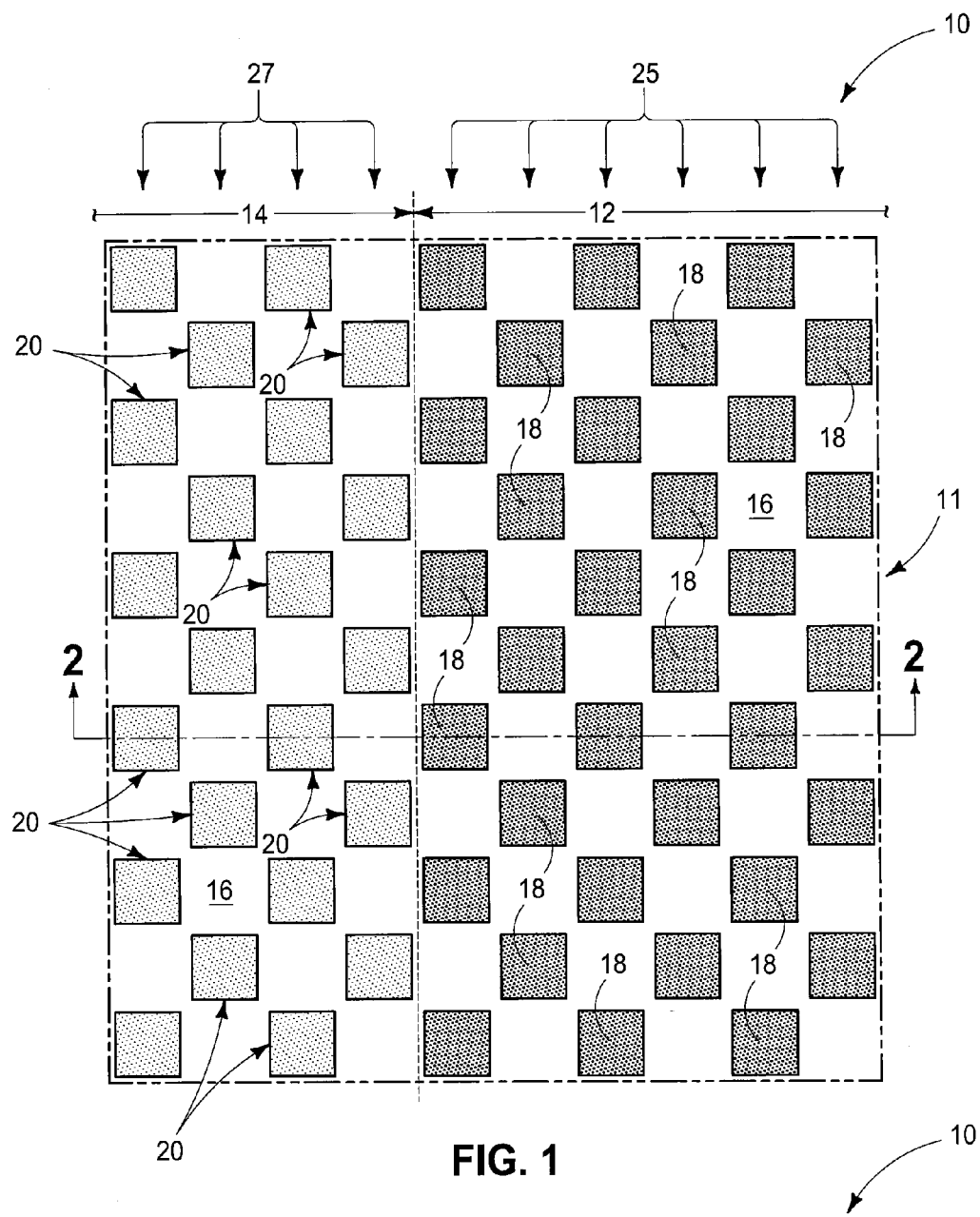
FIG. 1 is a diagrammatic top-down or bottom-up view of a photomask in accordance with an embodiment of the invention.

Embodiments of the invention encompass photomasks, methods of manufacturing photomasks, and methods of photolithographically patterning a substrate. Initial example embodiments are described with reference to FIGS. 1 and 2 which show a portion of a photomask 10 comprising a substrate 11. Substrate 11 may be homogenous or non-homogenous, and regardless will comprise some transparent material 16. Quartz is but one example, with an example thickness range being from about 0.125 inch to about 1.25 inch. In the context of this document "transparent material" passes at least 80% of the incident radiation/actinic energy with which the photomask is designed to operate. As an example, transparent quartz material may be used that passes 94% of incident radiation there-through.

Photomask 10 comprises a device region 12 and an adjacent edge region 14 over/relative to transparent material 16. Device region 12 comprises spaced primary features 18 of constant pitch (e.g., $P_1$) at least adjacent edge region 14. In one embodiment and as shown, spaced primary features 18 are individually of square cross-section and arranged in rows/columns 25, and wherein immediately adjacent rows 25 are offset relative one another. As an example, such a photomask may be used to fabricate or pattern an array of contact openings onto an integrated circuit substrate in the process of manufacture. Any other existing or yet-to-be developed configuration primary features may be used, for example a plurality of spaced and parallel elongated lines. Regardless, the spaced primary features of constant pitch at least adjacent the edge region need not be of the same size and shape, although in one embodiment and as shown such are so-constructed. Regardless, in one embodiment, at least ten adjacent rows of primary features adjacent the edge region are of the constant pitch, with only six such adjacent rows 25 of constant pitch $P_1$ being shown for clarity and brevity in FIGS. 1 and 2.

Figure 2:
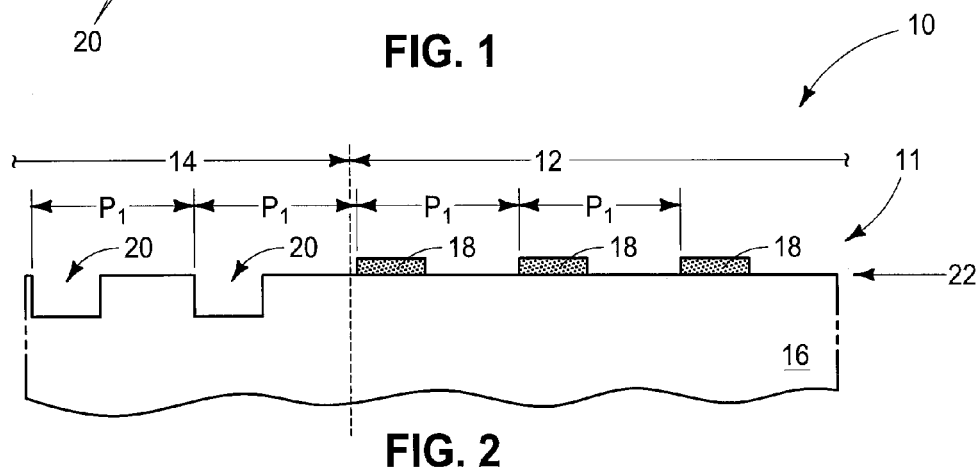
FIG. 2 is a diagrammatic sectional view of the photomask of FIG. 1 taken through line 2-2 in FIG. 1.

Primary features 18 may be of any suitable configuration relative to underlying transparent material 16. FIGS. 1 and 2 show an example embodiment wherein primary features 18 comprise material that is elevationally outward of a general global outermost surface 22 of transparent material 16, and which in the depicted embodiment is shown as being planar. Other outer surfaces and/or constructions are contemplated. By way of example only, spaced primary features 18 may be recessed partially or wholly within transparent material 16 and/or comprise indentations within transparent material 16. In one embodiment, primary features 18 may be essentially 100% opaque to the designed incident patterning radiation, whereby for example photomask 10 is a binary photomask. As a specific example, primary features 18 may comprise chromium provided at an example thickness range of from about 500 Angstroms to about 1000 Angstroms. Alternately as an example, spaced primary features 18 may comprise phase-shifting material that has been formed over transparent material 16. For example, phase-shifting material may contain silicon, and for example in one embodiment may comprise a silicide. Specific possible phase-shifting materials by way of example only include those selected from the group consisting of $MoSi_x$, $MoSi_xO_y$, $MoSi_xO_yN_z$, $Ta_xHf_y$, $Ta_xN_y$, $Si_xO_xN_y$, and mixtures thereof, where "x", "y", and "z" are greater than 0. An example thickness range for phase-shifting material features is from about 200 Angstroms to about 2000 Angstroms. A combination of opaque material(s), phase-shifting material(s), and one or more different thickness transparent material(s) may be used for the primary features, and regardless of whether those materials are spaced relative one another and/or received juxtaposed elevationally over one another.

Edge region 14 comprises spaced sub-resolution assist features 20 of the constant pitch (e.g., $P_1$ in FIGS. 1 and 2) of spaced primary features 18 at least adjacent device region 12. Additionally, spaced sub-resolution assist features 20 are off-phase by from about 30° to about 150° from +/−180° (i.e., plus or minus from about 30° to 150° from a perfect +/−180° from 0° phase-shift). In one embodiment, the spaced sub-resolution features are off-phase from about 40° to about 80° from +/−180°, in one embodiment from about 50° to about 70° from +/−180°, and in one embodiment by about 60° from +/−180°. In one embodiment and as shown, spaced sub-resolution assist features 20 of the constant pitch at least adjacent device region 12 are in rows 27. In one embodiment, the row of spaced sub-resolution assist features closest to device region 12 and the adjacent row of primary features are on-pitch relative one another. In one embodiment, at least three adjacent rows of sub-resolution assist features 20 adjacent device region 12 are of the constant pitch (e.g., $P_1$ in FIGS. 1 and 2).

In one embodiment, the sub-resolution assist features are of the same cross-sectional size and shape of those primary features that are adjacent edge region 14. Alternately, the sub-resolution assist features may be of different cross-sectional size and/or shape (not shown) as such primary features but at the constant pitch. FIGS. 1 and 2 by way of example only show an embodiment wherein the primary features 18 are in the form of contact-like features as are the sub-resolution assist features 20. As alternate examples, the primary features may be of contact-type and the sub-resolution assist features may be of the rigger-type (i.e., elongated parallel lines) or vice-versa. The sub-resolution assist features and the primary features need not respectively and individually be of the same size, shape or type. Regardless, in one embodiment and as shown, the spaces between adjacent primary features 18 and adjacent sub-resolution assist features 20 have greater maximum width than maximum width of primary features 18 and of the sub-resolution assist features 20.

Sub-resolution assist features 20 may be of any suitable configuration, with FIGS. 1 and 2 showing features 20 as comprising indentations in transparent material 16. Other constructions are contemplated, with only some additional examples being described below. Regardless, FIGS. 1 and 2 also depict an example embodiment wherein at least that portion of edge region 14 bearing sub-resolution assist features 20 is composed of all transparent material. The depth of the example indentation-form sub-resolution assist features 20 within transparent substrate material 16 may be readily selected by the artisan to provide a suitable and targeted off-phase phase-shift between from about 30° to about 150° from +/−180°. Thereby, those features will not resolve on a substrate that is patterned using the photomask. Nevertheless, additional features (not shown) may be provided in some part of the edge region which do resolve on the substrate process using a photomask in accordance with the invention.

Figure 3:
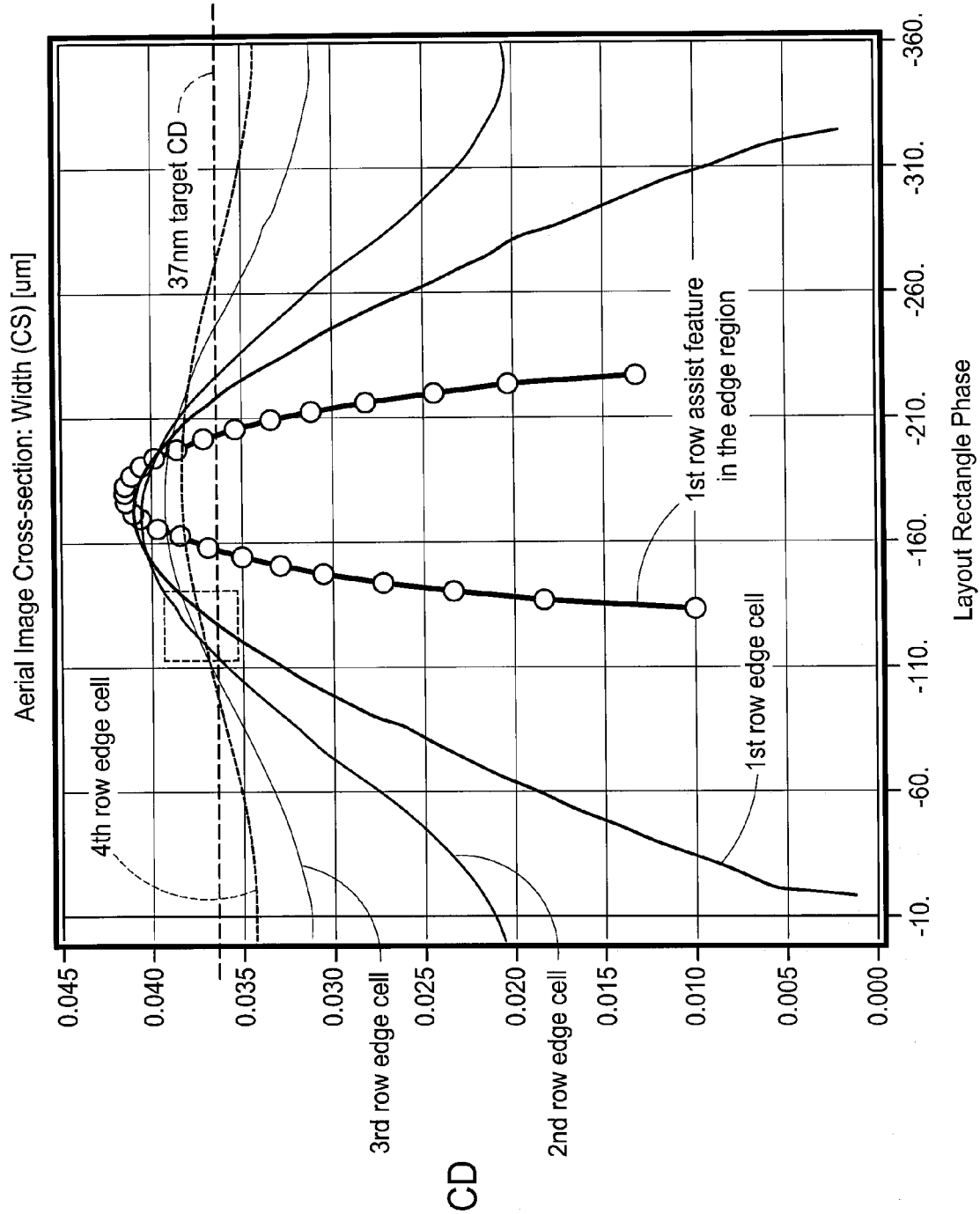
FIG. 3 is an aerial image simulation of critical dimensions of certain primary features and a $1^{st}$ row of sub-resolution assist features as a function of phase shifts from 0° for sub-resolution assist features, where a target CD is about 37 nanometers.

FIG. 3 depicts example aerial image modeling using computer simulation with respect to multiple photomasks of the FIGS. 1 and 2 construction where primary features 18 comprise phase-shifting material. The depicted graph shows contact critical dimension (CD) that will resolve on a substrate using photomasks of FIGS. 1 and 2 as a function of different phase-shifts from 0° and for $1^{st}$ row sub-resolution assist features that will not resolve. Reference to "edge cell" is of a respective primary feature that is in one of the first four rows 25 of primary features 18 that are adjacent the example demarcation line defining or separating edge region 14 and device region 12. The "1st row assist feature in the edge region" is with respect to an assist feature 20 that is in the first row 27 of assist features 20 that is adjacent such demarcation line. For a targeted resolving primary feature of a desired constant CD of about 37 nanometers, such shows a targeted off-phase of about 60° from +/−180° (i.e., 120° from 0° or no phase-shift) for sub-resolution assist features 20 to produce substantially uniform primary features.

Figure 4:
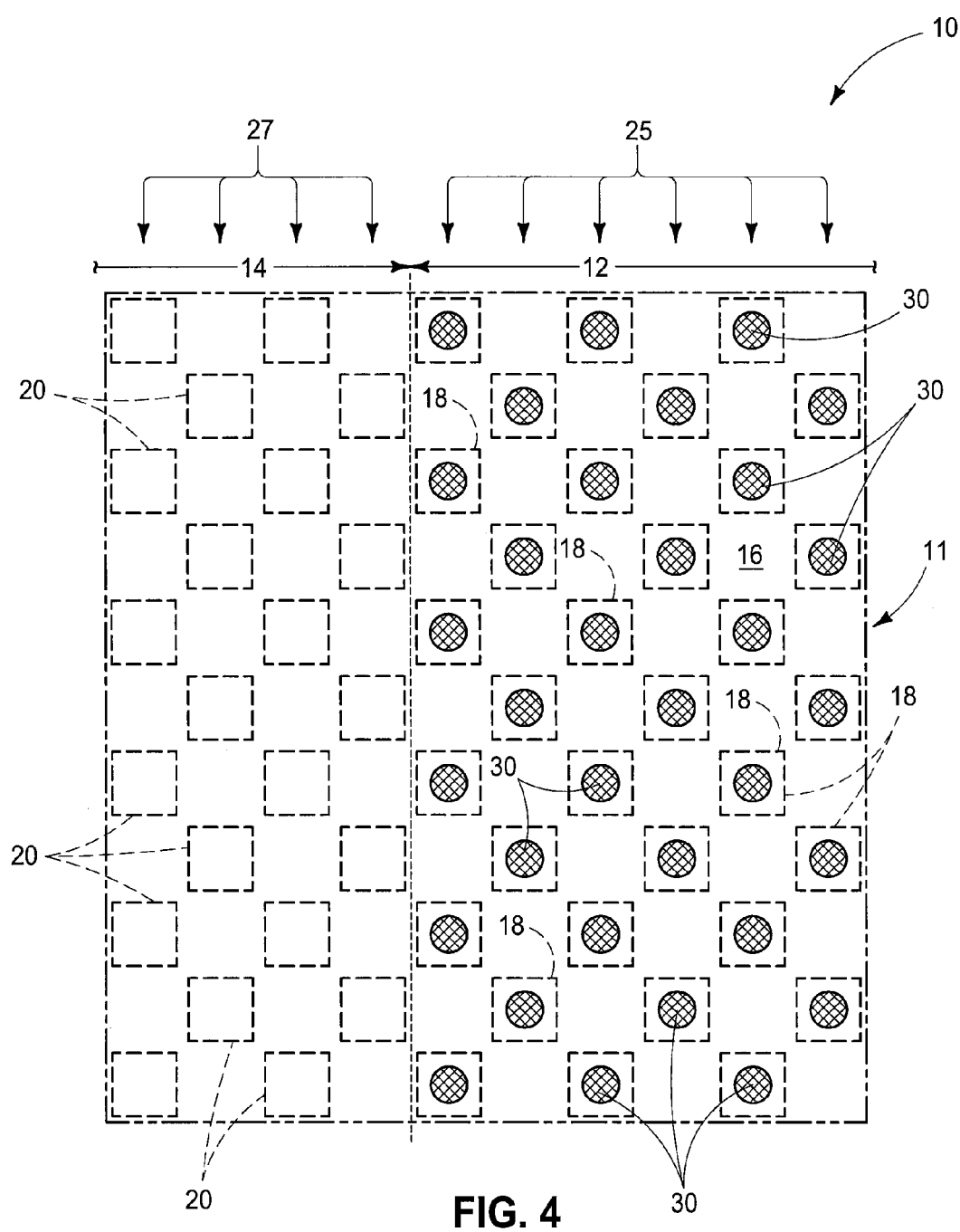
FIG. 4 is an aerial image simulation of feature resolution on a substrate processed using the photomask of FIGS. 1 and 2.

FIG. 4 depicts example aerial image modeling using computer simulation with respect to a photomask of the FIGS. 1 and 2 construction having sub-resolution assist features 20 fabricated to be off-phase at the targeted 60° from +/−180° referred to above with respect to FIG. 3. Features 30 are those that will resolve using a photomask of FIGS. 1 and 2 wherein spaced primary features 18 comprise example phase-shifting material targeted to produce about a +/−180° phase-shift. As shown in FIG. 4, features 30 will resolve within device region 12 on a substrate processed with the photomask of FIGS. 1 and 2, whereas features do not resolve within edge region 14 from sub-resolution assist features 20. Additionally ideally in overcoming problems identified above in the "Background" section, the depicted resolving features 30 are of the same substantial size and shape proximate the edge of device region 12 relative to those further away from such edge defined by the demarcation line separating or defining regions 12 and 14.

Figure 5:
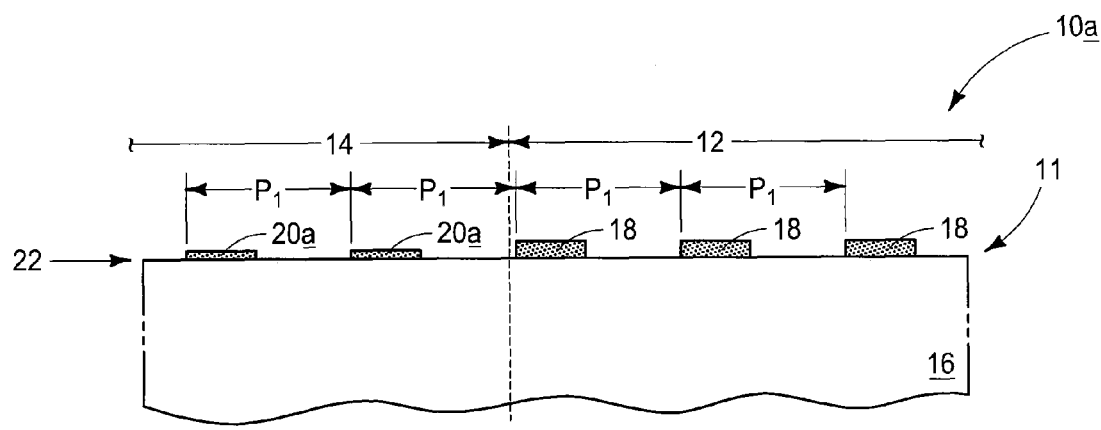
FIG. 5 is a diagrammatic sectional view of a photomask in accordance with an embodiment of the invention.

FIGS. 1 and 2 show an example embodiment wherein the sub-resolution assist features comprise indentations in the transparent material. FIG. 5 shows an alternate example embodiment photomask 10a. Like numerals from the above-described embodiments have been used where appropriate, with some construction differences being indicated with the suffix "a". Photomask 10a comprises sub-resolution assist features 20a which comprise mesas, for example relative to surface 22. The mesas may comprise one or more of phase-shifting material and transparent material. The artisan can select thickness of sub-resolution assist features 20a depending on material and desired degree of off-phase from about 30° to 150° from +/−180°. By way of example only where the material of features 18 and 20a is the same and is $MoSi_x$, as example thickness for primary features 18 is about 620 Angstroms and that for sub-resolution assist features 20a of about 350 Angstroms. Regardless, embodiments of the invention include sub-resolution assist features which comprise one or more phase-shifting material(s) whether in the form of mesas or other constructions, for example also being formed wholly or partly within transparent material 16 (not shown).

Figure 6:
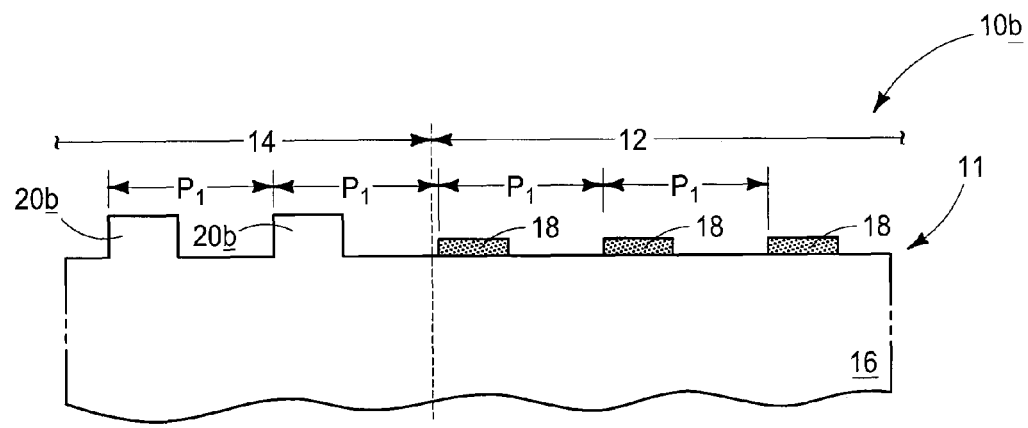
FIG. 6 is a diagrammatic sectional view of a photomask in accordance with an embodiment of the invention.

In one embodiment where the sub-resolution assist features comprise mesas, such may comprise transparent material(s) for example as shown with respect to a photomask 10b in FIG. 6. Like numerals from the above-described embodiments have been used where appropriate, with some construction differences being indicated with the suffix "b". Sub-resolution assist features 20b of photomask 10b are shown as comprising transparent material, and which in one embodiment may be of the same composition as that of transparent material 16. By way of example only, the FIG. 6 construction might be formed by initially etching transparent material 16 inwardly whereby raised mesa sub-resolution assist features 20b are formed by masking material received thereover during such etching. Alternately but less ideal, transparent material of the same or different composition as that of transparent material 16 may be deposited over transparent material 16 and subsequently subtractively patterned.

In one embodiment, the photomask is fabricated to be an attenuated phase-shift mask and wherein the sub-resolution assist features comprise phase-shifting material, with FIG. 5 showing a portion of one such example photomask where individual features 18 comprise one or more phase-shifting material(s). In one embodiment, the sub-resolution assist features also comprise one or more phase-shifting material(s), and which in one embodiment is thinner than the phase-shifting material(s) of the primary features in the device region. In one embodiment where the sub-resolution assist features comprise phase-shifting material, the phase-shifting material(s) of the sub-resolution assist features and of the primary features are of the same composition.

In one embodiment, the photomask is an attenuated phase-shift mask wherein the sub-resolution assist features are transparent. For example, FIGS. 1 and 2, show such an example photomask when primary features 18 comprise phase-shifting material and assist features 20 are inherently transparent as being formed within transparent material 16. FIG. 6 also shows such an example photomask wherein primary features 18 comprise phase-shifting material and assist features 20b are inherently transparent mesas.

In one embodiment, the photomask is a binary mask wherein the sub-resolution assist features are transparent. FIGS. 1 and 2 may be considered as depicting such an example when primary features 18 are opaque and sub-resolution assist features 20 are transparent as being formed within transparent material 16. Alternately, FIG. 6 may be considered such an embodiment when primary features 18 are fabricated to be opaque and sub-resolution mesa-like assist features 20b are fabricated to be transparent. In one embodiment, the photomask comprises a binary mask and wherein the sub-resolution assist features comprise phase-shifting material. For example, FIG. 5 may be considered as showing such an embodiment when primary features 18 are opaque and sub-resolution assist features 20a are composed of phase-shifting material.

Figure 7:
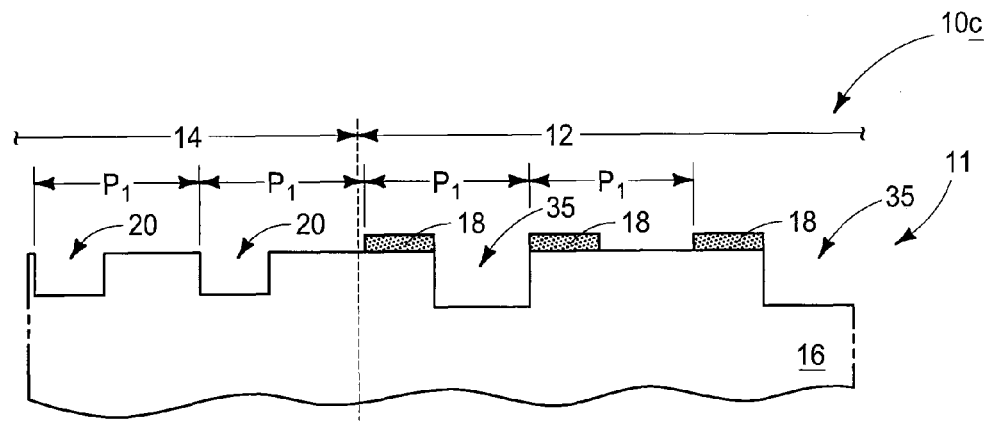
FIG. 7 is a diagrammatic sectional view of a photomask in accordance with an embodiment of the invention.

Embodiments of the invention also encompass photomasks which are in the form of an alternating phase-shift mask, for example as shown with respect to a photomask 10c in FIG. 7. Like numerals from the above-described embodiments have been used where appropriate, with some construction differences being indicated with the suffix "c" or with additional numerals. Photomask 10c comprises binary primary features 18 and alternating trenches 35. Trenches 35 are configured to produce the incident radiation passing there-through and passing through the spaces between primary features 18 that do not have such trenches at about a +/−180° phase-shift. Sub-resolution assist features 20 in photomask 10c are shown to be of the type of that shown in FIG. 2, although embodiments as described above with respect to FIGS. 5 and 6 may also alternately be used.

Embodiments of the invention also encompass methods of forming a photomask. Such a method comprises forming a device region over a transparent substrate, where the device region comprises spaced primary features of constant pitch at least adjacent an edge of the device region. An edge region is formed over the transparent substrate adjacent the edge of the device region. The edge region comprises spaced sub-resolution assist features of the constant pitch of the spaced primary features at least adjacent the device region and are off-phase by about 30° to about 150° from +/−180°.

In one embodiment, the act of forming spaced sub-resolution assist features comprises etching into transparent material of the transparent substrate. For example and by way of example only with respect to the embodiments of FIGS. 2 and 7, sub-resolution assist features 20 may be formed by etching the depicted configurations into substrate material 16. With respect to the example embodiment of FIG. 6 as an alternate example, sub-resolution assist features 20b may be etched by masking such portions of substrate material 16 and etching surrounding material, and thereafter forming primary features 18.

In one embodiment, the act of forming the spaced sub-resolution assist features does not comprise any etching into transparent material of the transparent substrate. For example with respect to the embodiment of FIG. 5, sub-resolution assist features 20a may be formed by deposition and without any etching of transparent material 16 to form such.

In one embodiment, the act of forming spaced sub-resolution assist features comprises depositing and patterning phase-shifting material, and in one embodiment comprises depositing and patterning transparent material.

In one embodiment, the photomask is an attenuated phase-shift mask and the spaced sub-resolution assist features are formed by etching into transparent material of a transparent substrate. In one embodiment, the photomask is an attenuated phase-shift mask and the spaced sub-resolution assist features are formed by depositing and patterning phase-shifting material.

In one embodiment, the sub-resolution assist features and the primary features are formed at the same time, and in one embodiment are formed at different times.

Figure 8:
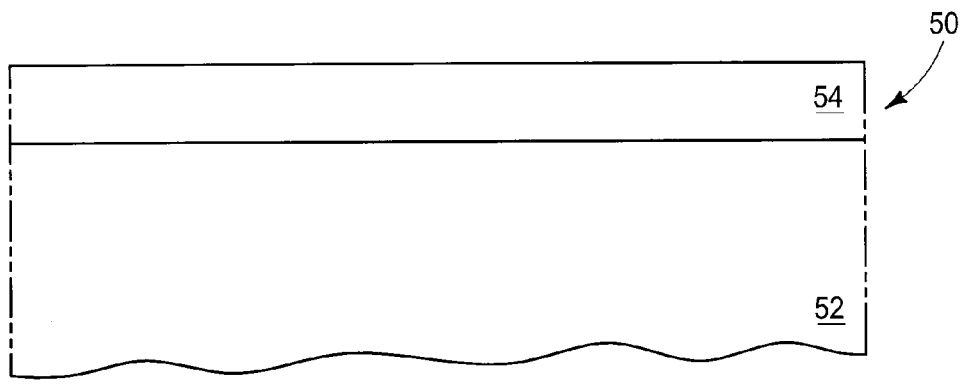
FIG. 8 is a diagrammatic sectional view of a portion of a substrate in process in accordance with an embodiment of the invention.

Embodiments of the invention also encompass methods of photolithographically patterning a substrate, for example using one or more of the above example photomasks. By way of example only, FIG. 8 depicts a substrate 50 to be photolithographically patterned. Such comprises some substrate 52 having imaging material 54 formed thereover. In the context of this document, the term "imaging material" defines material which is capable of having its solvent solubility changed by exposure to suitable actinic energy, and whether existing or yet-to-be developed. Photoresist and certain polyimides are, by way of example only, such materials.

Figure 9:
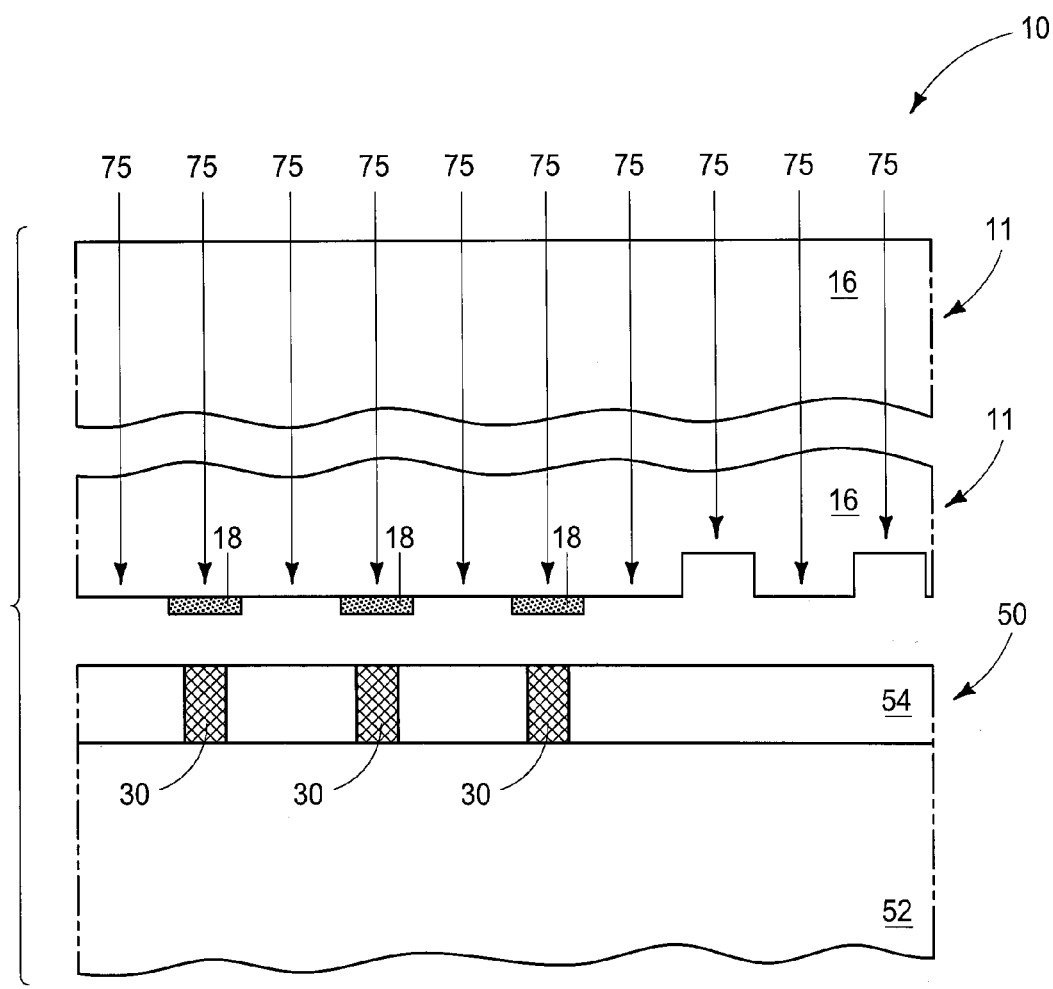
FIG. 9 is a view of the FIG. 8 substrate at a processing stage subsequent to that shown by FIG. 8 and using the photomask of FIGS. 1 and 2.

Referring to FIG. 9, a mask is positioned proximate imaging material 54. By way of example, any of the above-described photomasks 10, 10a, 10b, and 10c are example usable photomasks, with photomask 10 being depicted in FIG. 9. Actinic energy is impinged at the mask through the transparent material within the device and edge regions and onto imaging material 54 on substrate 50. Such is shown by example with arrows 75, and whereby features 30 are formed relative to imaging material 54.

CONCLUSION

In some embodiments, a photomask comprises a substrate comprising a device region and an adjacent edge region over transparent material. The device region comprises spaced primary features of constant pitch at least adjacent the edge region. The edge region comprises spaced sub-resolution assist features of the constant pitch of the spaced primary features at least adjacent the device region and which are off-phase by from about 30° to about 150° from +/−180°.

In some embodiments, a method of photolithographically patterning a substrate comprises forming imaging material on a substrate. A mask is positioned proximate the imaging material. The mask comprises a device region and an adjacent edge region over transparent material. The device region comprises spaced primary features of constant pitch at least adjacent the edge region. The edge region comprises spaced sub-resolution assist features of the constant pitch of the spaced primary features at least adjacent the device region and which are off-phase by from about 30° to about 150° from +/−180°. Actinic energy is impinged at the mask through the transparent material within the device and edge regions and onto the imaging material on the substrate.

In some embodiments, a method of forming a photomask comprises forming a device region over a transparent substrate. The device region comprises spaced primary features of constant pitch at least adjacent an edge of the device region. An edge region is formed over the transparent substrate adjacent the edge of the device region. The edge region comprises spaced sub-resolution assist features of the constant pitch of the spaced primary features at least adjacent the device region and which are off-phase by from about 30° to about 150° from +/−180°.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of photolithographically patterning a substrate, comprising:
   forming imaging material on a substrate;
   positioning a mask proximate the imaging material, the mask comprising a device region and an adjacent edge region over transparent material, the device region comprising spaced primary features of constant pitch at least adjacent the edge region, the edge region comprising spaced sub-resolution assist features of the constant pitch of the spaced primary features at least adjacent the device region and being off-phase by from about 30° to about 150° from +/−180°; and
   impinging actinic energy perpendicularly at the mask through the transparent material within the device and edge regions and perpendicularly onto the imaging material on the substrate.

2. The method of claim 1 wherein the spaced sub-resolution assist features are off-phase by from about 40° to about 60° from +/−180°.

3. The method of claim 2 wherein the spaced sub-resolution assist features are off-phase by from about 50° to about 60° from +/−180°.

4. A method of forming a photomask, comprising:
   forming a device region over a transparent substrate, the device region comprising spaced primary features of constant pitch at least adjacent an edge of the device region; and
   forming an edge region over the transparent substrate adjacent the edge of the device region, the edge region comprising spaced sub-resolution assist features of the constant pitch of the spaced primary features at least adjacent the device region and being off-phase by from about 30° to about 60° from +/−180°.

5. The method of claim 4 wherein forming the spaced sub-resolution assist features comprises etching into transparent material of the transparent substrate.

6. The method of claim 4 wherein forming the spaced sub-resolution assist features does not comprise etching into transparent material of the transparent substrate.

7. The method of claim 4 wherein forming the spaced sub-resolution assist features comprises depositing and patterning phase-shifting material.

8. The method of claim 4 wherein forming the spaced sub-resolution assist features comprises depositing and patterning transparent material.

9. The method of claim 4 wherein the photomask is an attenuated phase-shift mask and forming the spaced sub-resolution assist features comprises etching into transparent material of the transparent substrate.

10. The method of claim 4 wherein the photomask is an attenuated phase-shift mask and forming the spaced sub-resolution assist features comprises depositing and patterning phase-shifting material.

11. The method of claim 4 comprising forming the sub-resolution assist features and the primary features at the same time.

12. The method of claim 4 comprising forming the sub-resolution assist features and the primary features at different times.

13. The method of claim 4 comprising forming the spaced sub-resolution assist features to be off-phase by from about 40° to about 60° from +/−180°.

14. The method of claim 13 comprising forming the spaced sub-resolution assist features to be off-phase by from about 50° to about 60° from +/−180°.

15. The method of claim 4 wherein,
   the spaced primary features of constant pitch at least adjacent the edge region are formed in rows, at least ten adjacent rows of primary features adjacent the edge region being of the constant pitch; and
   the spaced sub-resolution assist features of the constant pitch at least adjacent the device region are formed in rows, at least three adjacent rows of primary features adjacent the device region being of the constant pitch.

16. The method of claim 4 wherein the spaces between adjacent primary features and adjacent sub-resolution assist features have greater maximum width than maximum width of the primary features and of the sub-resolution assist features.

17. The method of claim 4 wherein the sub-resolution assist features are formed to be of the same cross-sectional size and shape as said primary features that are adjacent the edge region, spaces between adjacent primary features and adjacent sub-resolution assist features being formed to have greater maximum width than maximum width of the primary features and of the sub-resolution assist features.

18. The method of claim 4 wherein the spaced primary features and the spaced sub-resolution assist features are formed to be contact-type features arranged in rows, immediately adjacent the rows being offset relative one another.

19. The method of claim 4 wherein the spaced primary features are formed to be contact-type features and the spaced sub-resolution features are formed to be rigger-type features.

20. The method of claim 4 wherein the spaced primary features are formed to be rigger-type features and the spaced sub-resolution features are formed to be contact-type features.

21. A method of forming a photomask, comprising:
forming a device region over a transparent substrate, the device region comprising spaced primary features of constant pitch at least adjacent an edge of the device region; and
forming an edge region over the transparent substrate adjacent the edge of the device region, the edge region comprising spaced sub-resolution assist features of the constant pitch of the spaced primary features at least adjacent the device region and being off-phase by about 60° from +/−180°.

22. A method of photolithographically patterning a substrate, comprising:
forming imaging material on a substrate;
positioning a mask proximate the imaging material, the mask comprising a device region and an adjacent edge region over transparent material, the device region comprising spaced primary features of constant pitch at least adjacent the edge region, the edge region comprising spaced sub-resolution assist features of the constant pitch of the spaced primary features at least adjacent the device region and being off-phase by from about 30° to about 60° from +/−180°; and
impinging actinic energy at the mask through the transparent material within the device and edge regions and onto the imaging material on the substrate.

* * * * *